United States Patent [19]

Hamakawa et al.

[11] Patent Number: 5,021,103
[45] Date of Patent: Jun. 4, 1991

[54] METHOD OF FORMING MICROCRYSTALLINE SILICON-CONTAINING SILICON CARBIDE FILM

[75] Inventors: Yoshihiro Hamakawa, 3-17-4, Minamihanayashiki, Kawanishi-shi, Hyogo-ken; Hiroaki Okamoto, Kawanishi; Yutaka Hattori, Takatsuki, all of Japan

[73] Assignees: Nippon Soken, Inc., Nishio; Nippondenso Co., Ltd., Kariya; Yoshihiro Hamakawa, Kawanishi, all of Japan

[21] Appl. No.: 517,479

[22] Filed: May 2, 1990

Related U.S. Application Data

[63] Continuation of Ser. No. 173,446, Mar. 25, 1988, abandoned.

[30] Foreign Application Priority Data

Aug. 22, 1987 [JP] Japan .................. 62-208987

[51] Int. Cl.$^5$ .......................................... H01L 31/101
[52] U.S. Cl. .................. 148/33; 148/DIG. 1; 148/DIG. 148; 148/33.4; 148/33.5; 437/3; 437/100; 136/258
[58] Field of Search ............ 148/DIG. 1, 45, 72, 148/120, 148, 153, 158, 169, 172, 33, 33.1, 33.4, 33.5; 427/38, 39; 357/2, 29, 30, 58, 59; 437/2-4, 18, 51, 54, 100, 101, 223, 914, 916; 136/258, 259, 256

[56] References Cited

U.S. PATENT DOCUMENTS

| | | | |
|---|---|---|---|
| 4,450,316 | 5/1984 | Hamakawa et al. | 136/256 |
| 4,559,552 | 12/1985 | Yamazaki | 357/2 |
| 4,591,893 | 5/1986 | Yamazaki | 357/2 |

FOREIGN PATENT DOCUMENTS 60-117711 6/1985 Japan .

OTHER PUBLICATIONS

Hattori et al., "Valency Control of a SIC:H prepared by ECR Plasma CVD" in Extended Abstracts of 34th. Spring Meeting of Japan Society of Applied Physics and Related Societies published Mar. 28, 1987.
Translation of 29p-F-17, "Valency Control of a-SiC:H Prepared by ECR Plasma CVD" in Extended Abstracts of 34th. Spring Meeting of Japan Society of Applied Physics and Related Societies published Mar. 28, 1987
Translation of Abstract of Japanese 60-117711, "Forming Apparatus of Thin Film".
Translation of 29p-F-18, "Improvement of P Type Injector In a-SiC Thin Film LED by ECR CVD" in Extended Abstracts of 34th. Spring Meeting of Japan Society of Applied Physics and Related Societies published Mar. 28, 1987.

Primary Examiner—Olik Chaudhuri
Assistant Examiner—William Bunch
Attorney, Agent, or Firm—Cushman, Darby & Cushman

[57] ABSTRACT

A microcrystalline silicon-containing silicon carbide semiconductor film has an optical energy gap of not less than 2.0 eV, and a dark electric conductivity of less than $10^{-6} Scm^{-1}$. The Raman scattering light of the microcrystalline silicon-containing silicon carbide semiconductor film, which shows the presence of silicon crystal phase, has a peak in the vicinity of 530 cm$^{-1}$. This microcrystalline silicon-containing silicon carbide semiconductor film is formed on a substrate by preparing a mixture gas having a hydrogen dilution rate $\gamma$, which is the ratio of the partial pressure of hydrogen gas to the sum of the partial pressure of a silicon-containing gas and the partial pressure of a carbon-containing gas, of 30, transmitting microwave of a frequency of not less than 100 MHz into the mixture gas near a substrate with an electric power density of not less than $4.4 \times 10^{-2}$, and generating plasma at a temperature of the substrate of not less than 200° C. and under a gas pressure of not less than $10^{-2}$ Torr.

5 Claims, 8 Drawing Sheets (X80.000)

(X50.000)

METHOD OF FORMING MICROCRYSTALLINE SILICON-CONTAINING SILICON CARBIDE FILM

This is a continuation of application Ser. No. 07/173,446 filed Mar. 25, 1988 which was abandoned upon the filing hereof.

BACKGROUND OF THE INVENTION

1. Field of the Invention

The present invention relates to a microcrystalline silicon-containing silicon carbide (SiC) film preferably employed in an amorphous solar cell or the like, and a method of forming same.

2. Description of the Prior Art

Conventionally silicon carbide (SiC) film has been formed by a high frequency plasma CVD method.

The SiC film employed in an amorphous solar cell is required to have such properties as a wide optical energy gap and a high dark electric conductivity.

However, the above described conventional SiC film is low in both of the above described properties. And even by doping the conventional SiC film was boron for improving the above described properties, the resulting dark electric conductivity is only about $10^{-5}$ through $10^{-8}$ Scm$^{-1}$ at the optical energy gap Eg of about 2.0 eV.

And it is well known that the optical energy gap Eg can be increased by increasing the carbon content in the SiC film. However, as the carbon content is increased, the dark electric conductivity is rapidly decreased. For example, the dark electric conductivity at the optical energy gap of 2.1 eV is as small as $10^{-6}$ through $10^{-9}$ Scm$^{-1}$.

In the case in which a p-type amorphous (SiC(a-SiC) film formed by the conventional method is employed in a window layer (p layer) of a p-i-n type amorphous silicon solar cell, problems arise in that photo-electric current generated in an i layer due to the solar radiation cannot be effectively delivered to an external electrode because of low dark electric conductivity, and that solar radiation entering the solar cell is absorbed by the p layer because of the narrow optical energy gap thereof so as not to effectively reach an electricity generating layer (i layer)

SUMMARY OF THE INVENTION

It is an object of the present invention to provide a microcrystalline silicon-containing SiC semiconductor film having a wide optical energy gap and high dark electric conductivity.

The microcrystalline silicon-containing SiC semiconductor film according to the present invention has an optical energy gap of not less than 2.0 eV and a dark electric conductivity of not less than $10^{-6}$S cm$^{-1}$. And Raman scattering light showing the presence of silicon crystal phase has a peak in the vicinity of 520 cm$^{-1}$. The microcrystalline silicon-containing SiC semiconductor film according to the present invention is formed by preparing a mixture gas composed of a silicon-containing gas, a carbon-containing gas and a hydrogen gas so as to have a hydrogen dilution rate γ which is the ratio of the partial pressure[H] of the hydrogen gas to the sum of the partial pressure[S] of the silicon-containing gas and the partial pressure[C] of the carbon-containing gas, of not less than 30, supplying the prepared mixture gas into a reaction chamber, transmitting microwave having a frequency of not less than 100 MHz to the mixture gas with an electric power density of not less than $4.4\times10^{-2}$ W/cm$^3$, generating plasma near a substrate disposed within the reaction chamber at a substrate temperature of not less than 200° C. under a gas pressure of not more than $10^{-2}$ Torr whereby the SiC film is formed on the substrate.

The SiC film according to the present invention has a crystal structure wherein microcrystalline silicon is distributed like islands. This microcrystalline silicon exhibits an extremely high electric conductivity so as to increase the dark electric conductivity of the overall SiC film. This results in the increase in carbon content in the SiC film and accordingly the increase in optical energy gas as well as the improvement in dark electric conductivity.

As described above, according to the present invention, a microcrystalline silicon-containing SiC semiconductor film having a wide optical energy gap and a high electric conductivity can be obtained. Therefore, the photo-electric conversion efficiency of solar cells or the like can be improved.

DETAILED DESCRIPTION OF THE EMBODIMENT

Figure 1:
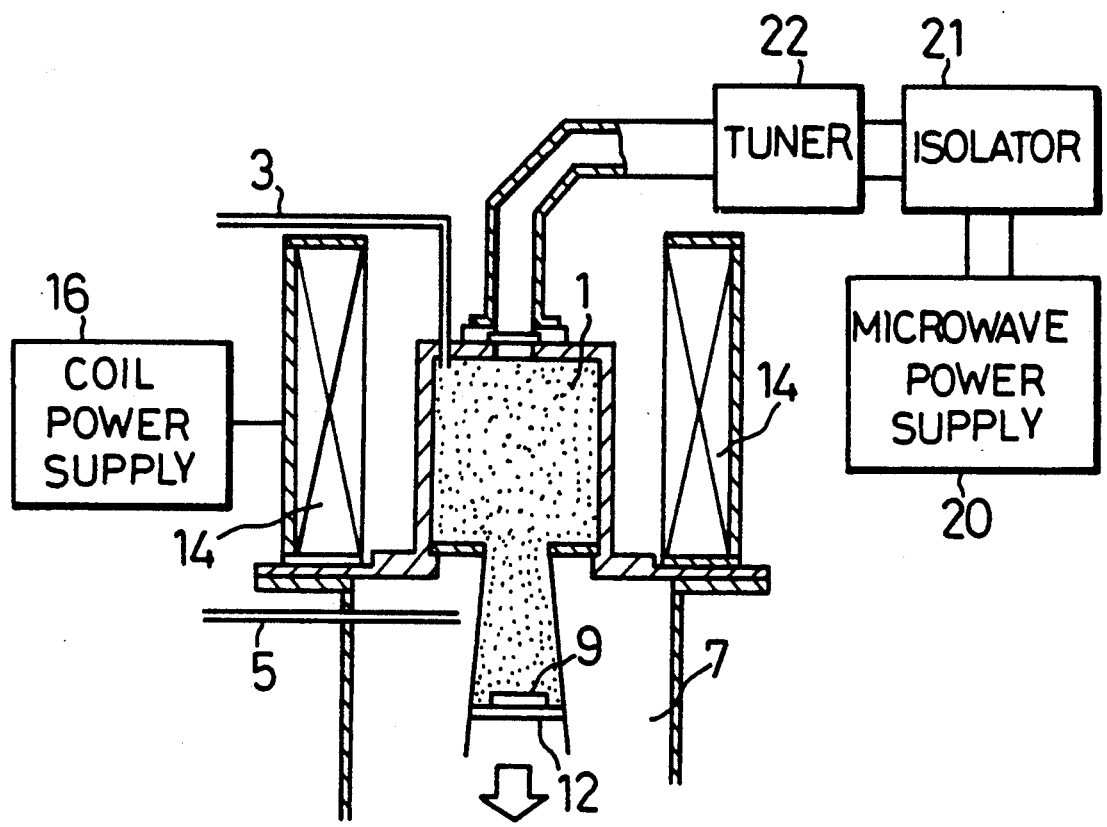
FIG. 1 is a schematic view illustrating an electron cyclotron resonance CVD device (ECRCVD device)

The microcrystalline silicon-containing SiC semiconductor film according to the present invention can be formed by electron cyclotron resonance plasma CVD method (hereinafter called ECRCVD method which employs plasma generated due to the resonance of electron cyclotron resulting from the transmission of microwave into a mixture gas.

The mixture gas includes a silicon-containing gas, a carbon-containing gas and a hydrogen gas.

The silicon-containing gas include silane gas such as monosilane ($SiH_4$) gas, disilane ($Si_2H_6$) gas, trisilane ($Si_3H_8$) gas and trimethylsilane ($SiH(CH_3)_3$) gas. Alternatively, the silicon-containing gas may include gas produced by substituting methyl group, ethyl group, fluorine, or chlorine for one part or all of hydrogen atom within the above silane gas.

The carbon-containing gas preferably include methane gas.

Alternatively, the carbon-containing gas may include chain hydrocarbon such as acetylene, ethylene, and the like, compound of element of group IIIa, such as trimethylboron, with hydrocarbon, gas obtained by substituting fluorine or chlorine for one part or all of hydrogen atom within the above chain hydrocarbon gas or compound gas, ketone such as acetone ($CH_3COCH_3$), or alcohol such as ethylalcohol ($C_2H_5OH$).

The hydrogen dilution rate $\gamma$ in the mixture gas can be expressed by the following equation:

$$\gamma = [H]/[S] + [C]$$

where [S] is the partial pressure of the silicon-containing gas, [C] is the partial pressure of the carbon-containing gas and [H] is the partial pressure of hydrogen gas.

It is preferable to increase the hydrogen dilution rate $\gamma$ to not less than 30. The hydrogen dilution rate $\gamma$ is voluntarily selected from the above range in accordance with the desired electric conductivity and optical energy gap. It can be considered that hydrogen plays an important role in forming microcrystalline silicon. When $\gamma$ is less than 30, the dark electric conductivity is rapidly decreased.

Microwave may have a frequency of not less than 100 MHz, which can be transmitted by way of a wave guide.

The electric Power density is defined by:

Electric Power Density = Microwave Electric Power/Volume of Plasma Chamber, and is normally required to be not less than $4.4 \times 10^{-2}$ W/cm$^3$ in order to perform good discharge.

There is no specific upper limit of the electric power density. But, the electric conductivity becomes nearly saturated at an electric power density of $10.9 \times 10$ W/cm$^3$ and does not increase at an electric power density above this value. Therefore, the electric power density may be preferably not more than $10.9 \times 10$ W/cm$^3$.

The substrate temperature is normally not less than 200° C. At a substrate temperature of less than 200° C., the microcrystalline silicon is not formed so that the electric conductivity decreases. At a too high substrate temperature, the electric conductivity is not greatly improved. And in this case, the material for the substrate is narrowly limited. Therefore, the substrate temperature range is preferably from 200° through 400° C.

Normally, the ECRCVD device is used under a gas pressure of not more than $10^{-2}$ Torr, and preferably $10^{-4}$ through $10^{-3}$ Torr. In the case of high pressure more than $10^{-2}$ Torr, it is difficult to introduce plasma generated in a plasma chamber into the reaction chamber. This results in the extreme decrease in film forming speed, and the lowering in film quality. Therefore, high electric conductivity cannot be obtained.

According to the present invention, the SiC film may be subjected to the valence electron control to p type by doping the SiC film with boron, for example, in order to improve the dark electric conductivity.

Impurity for doping is not limited to boron. Other elements of groups IIIa can achieve similar effect to that of the case of boron. In the case that the concentration of the above described impurity ($[B]/\{[S]+[C]\}$ where [B] is the partial pressure of gas containing elements of group IIIa, [S] is the partial pressure of silicon-containing gas and [C] is the partial pressure of carbon-containing gas) is less than 0.05%, any effect due to the addition of the impurity is not observed. In the case of not less than 4.0%, the optical energy gap is remarkably lowered, and accordingly preferable result cannot be obtained. Normally, the valence electron control is performed with a concentration of about 0.5 through 3.0%.

EXAMPLE 1

FIG. 1 illustrates an electron cyclotron resonance plasma CVD (ECRCVD) device. Into a plasma chamber 1 is supplied hydrogen gas ($H_2$) from an excitation gas supply pipe 3 with a flow rate of 20 sccm. And a mixture gas including 10 sccm of monosilane gas ($SiH_4$) which is diluted with hydrogen gas to have a concentration of 10%, 20 sccm of methane ($CH_4$) gas which is diluted with hydrogen gas to have a concentration of 10%, 75 sccm of diborane ($B_2H_6$) gas which is diluted with hydrogen gas to have a concentration of 500 ppm, and 40 sccm of hydrogen gas for diluting the other gas, is supplied to a reaction chamber 7 from a supply pipe 5. In this case, the ratio of the partial pressure of hydrogen gas within the reaction chamber 7 to that of monosilane gas and methane gas, that is the hydrogen dilution rate $\gamma$ ($\gamma = [H]/\{[S]+[C]\}$ where [H] is the partial pressure of hydrogen gas, [S] is the partial pressure of monosilane gas, and [C] is the partial pressure of methane gas) is 45.

The reaction chamber 7 is exhausted by an exhaust device composed of a diffusion pump (not shown) and a rotary pump (not shown) to keep the pressure of the reaction chamber 7 to $7 \times 10^{-4}$ Torr. At this time, a substrate 9 is kept at a temperature Ts of 300° C. by a substrate heating device 12.

Next, to an electron conductive coil 14 arranged so as to surround the plasma chamber 1 is supplied direct current from a coil power supply 16 to generate a magnetic field of about 875 gauss within the plasma chamber 1 and oscillate microwave of 2.45 GHz from a microwave power supply 20. Then, the electrical power of the microwave power supply 20, an isolator 21 and a tuner 22 are adjusted to transmit microwave of 300 W into the plasma chamber 1 which is 17 cm in diameter and 20.2 cm in length. As a result, stable plasma is generated in the plasma chamber 1 due to the electron resonance of microwave of TE113 mode, having a power density of $6.5 \times 10^{-2}$ W/cm$^3$. Upon continuing the above conditions for 4 hours, the SiC film having a thickness of 2365 Å is formed on the substrate 9. This SiC film has an optical energy gap of 2.33 eV and a dark electric conductivity ($\sigma d$) of $2 \times 10^{-1}$ Scm$^{-1}$.

Figure 2:
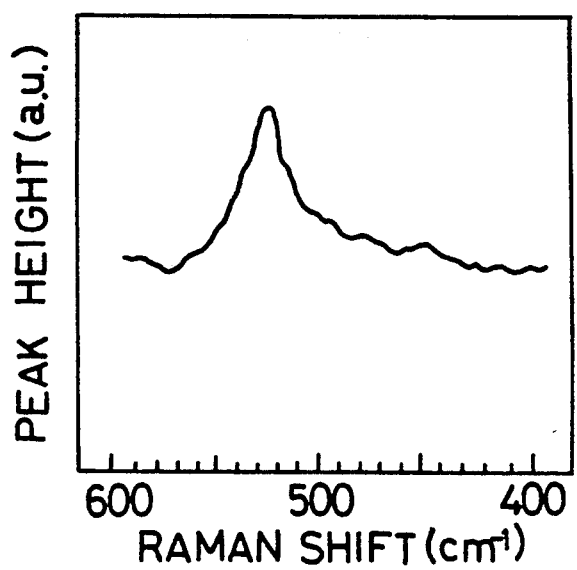
FIG. 2 is a graph of Raman spectrum of Example 1 according to the present invention.
Figure 4:
FIG. 4 is an enlarged photograph of Example 1.

The Raman spectroscopic analysis of this SiC film shows that a peak is observed in the vicinity of 520 cm$^{-1}$ as shown in FIG. 2. And TEM image is observed by means of a transmission electron microscope. In the observed TEM image, on island-shaped microcrystal phase which shows the presence of microcrystalline silicon is confirmed as shown in FIG. 4.

COMPARATIVE EXAMPLE 1

Into a capacitive coupling parallel plate plasma CVD device having an electrode area of 707 cm$^2$, are supplied 10 sccm of silane gas which is diluted with hydrogen gas to have a concentration of 10%, 23 sccm of methane gas which is diluted with hydrogen gas to have a concentration of 10%, and 10 sccm of diborne gas which is diluted with hydrogen gas to have a concentration of 500 ppm.

40 W of high frequency wave of 13.5 MHz is transmitted (57 mW/cm$^3$) for 2 hours at the substrate temperature (Ts) of 200° C. and under a reaction gas pressure of 0.6 Torr. As a result, a SiC film having a thickness of 3826 Å is obtained. The optical energy gap thereof is 2.2 eV and the dark electric conductivity is $5 \times 10^{-7}$ Scm$^{-1}$.

Figure 3:
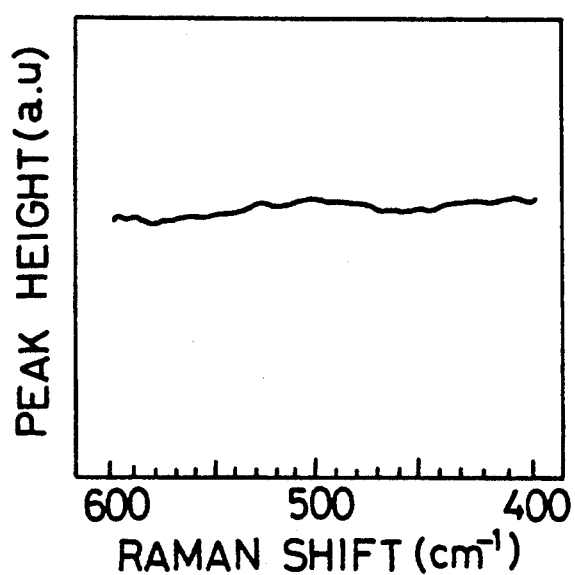
FIG. 3 is a graph of Raman spectrum of Comparative Example 1.

The Raman spectroscopic analysis of this SiC film shows a broad pattern as shown in FIG. 3. This pattern shows the presence of an amorphous phase. No peak is observed in the vicinity of 520 cm$^{-1}$.

Figure 5:
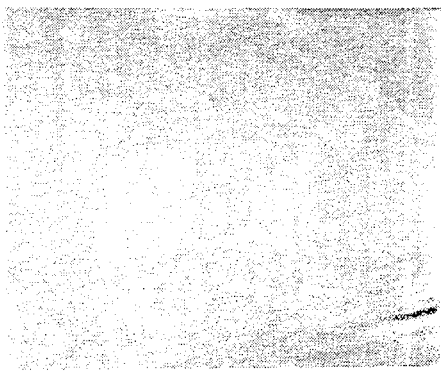
FIG. 5 is an enlarged photograph of Comparative Example 1.

The TEM image of the obtained SiC film which is observed by the transmission electron microscope shows a uniform crystal phase throughout the film as shown in FIG. 5. An island-shaped crystal phase as being observed in Example 1 is not observed.

EXAMPLE 2

Another SiC film is formed under the conditions substantially equal to those of Example 1 except for the substrate temperature. And the effect of the substrate temperature on the dark electric conductivity and optical energy gap of the SiC film is tested. The result is shown in FIG. 6.

Figure 6:
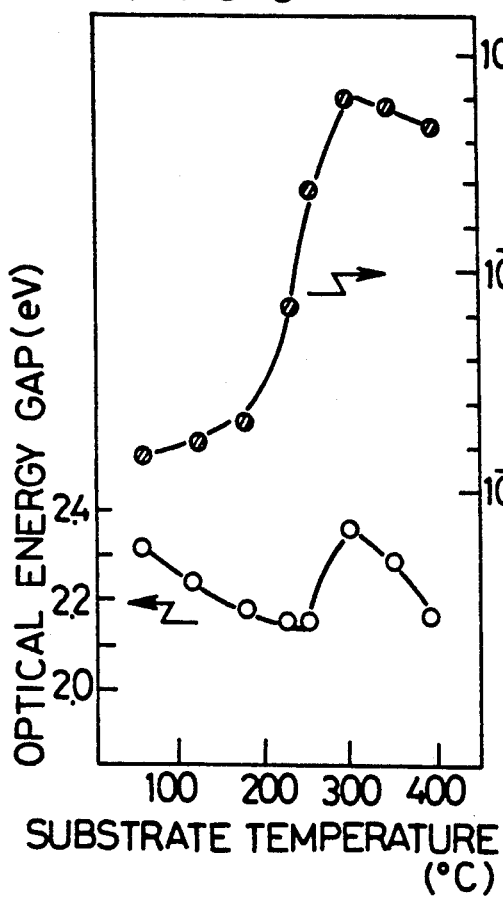
FIG. 6 is a characteristic graph showing the relation between substrate temperature and both optical energy gap and dark electric conductivity.
Figure 7:
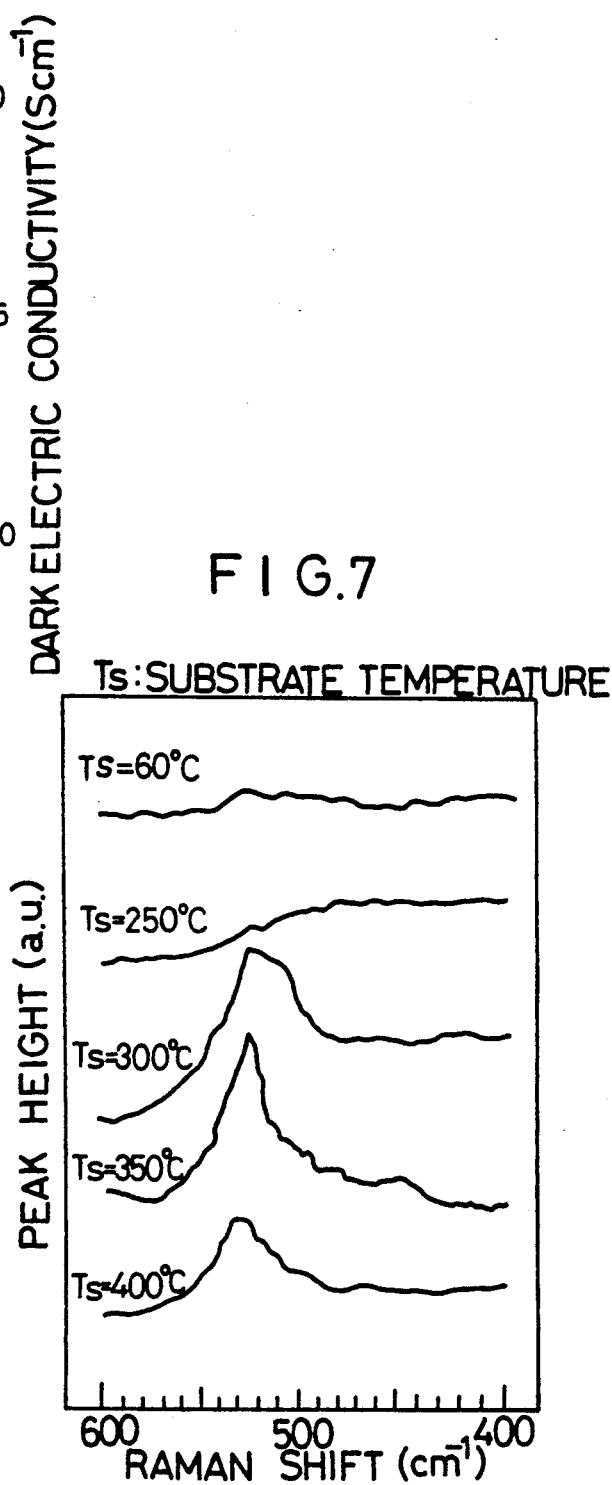
FIG. 7 is a characteristic graph showing the relation between the substrate temperature and the Raman spectrum.

As is apparent from FIG. 6, at a substrate temperature of less than 200° C., high dark electric conductivity cannot be obtained, but at a substrate temperature of not less than 200° C. great improvement in dark electric conductivity is observed. And Raman spectrum of each of samples exhibiting the above described high conductivities has a clear peak in the vicinity of 520 cm$^{-1}$ as shown in FIG. 7.

COMPARATIVE EXAMPLE 2

Comparative tests are performed by using a parallel plate high frequency plasma CVD device with the same gas flow rate as that of Example 2.

In these comparative tests, the high frequency power is 40 W, the reaction gas pressure is 0.6 Torr, and the substrate temperature is changed from 150° C. to 350° C.

The test results show that the dark electric conductivity of each of the obtained films is not more than $10^{-5}$ Scm, and that no peak is observed in the vicinity of 520 cm$^{-1}$ of the Raman shift.

EXAMPLE 3

SiC films are formed under the same conditions as those of Example 1 except for the power of the microwave transmitted to the CVD device for testing the effect of the microwave power on the electric dark conductivity of the SiC films. The test results are shown in FIG. 8.

Figure 8:
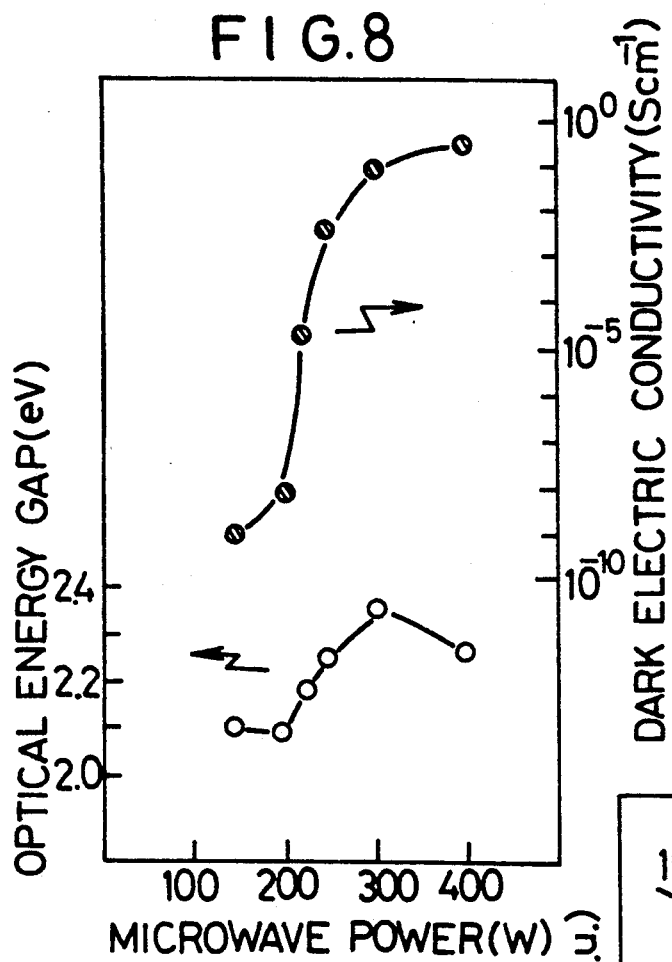
FIG. 8 is a characteristic graph showing the relation between the microwave electric power and the dark electric conductivity.
Figure 9:
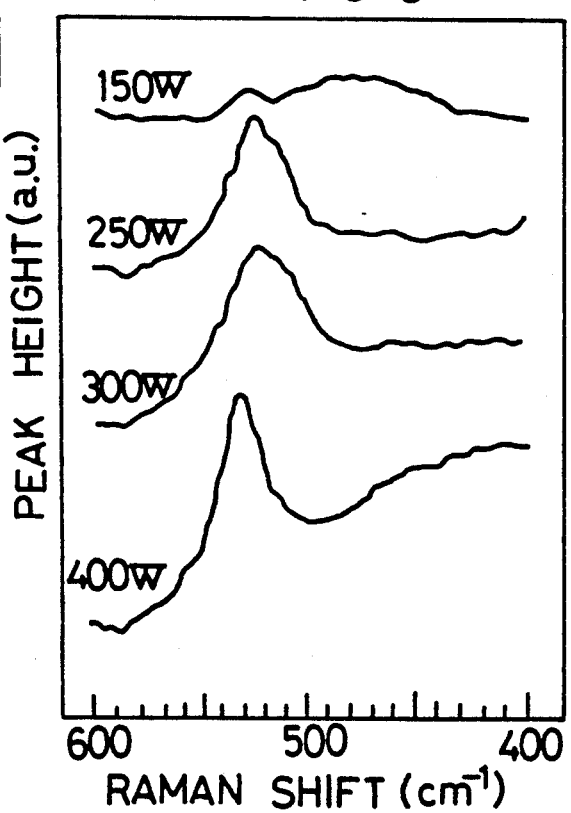
FIG. 9 is a characteristic graph showing the relation between the microwave electric power and the Raman spectrum.

As is apparent from FIG. 8, in the case of the microwave power of less than 200 W, namely, the microwave power density(=microwave power/plasma chamber volume) of less than $4.4 \times 10^{-2}$ W/cm$^3$, high electric dark conductivity cannot be obtained. In contrast, in the case of the microwave power of not less than 200 W, high dark electric conductivity can be obtained, and as shown in FIG. 9, the Raman spectrum has a clear peak in the vicinity of 520 cm$^{-1}$.

COMPARATIVE EXAMPLE 3

Comparative tests are performed by using a parallel plate high frequency plasma CVD device with the same gas flow rate as that of Example 2.

In these comparative tests, the substrate temperature is 200° C., the reaction gas pressure is 0.6 Torr, and the high frequency power is changed from 20 W to 200 W.

The test results show that the dark electric conductivity of each of the obtained SiC films is less than $10^{-5}$ Scm$^{-1}$. And no peak is observed in the vicinity of 520 cm$^{-1}$ of the Raman shift.

EXAMPLE 4

SiC films are formed under the same conditions as those of Example 1 except for the flow rate of hydrogen gas for testing the effect of the hydrogen dilution rate $\gamma$ of the mixture gas on the dark electric conductivity of the SiC film.

Figure 10:
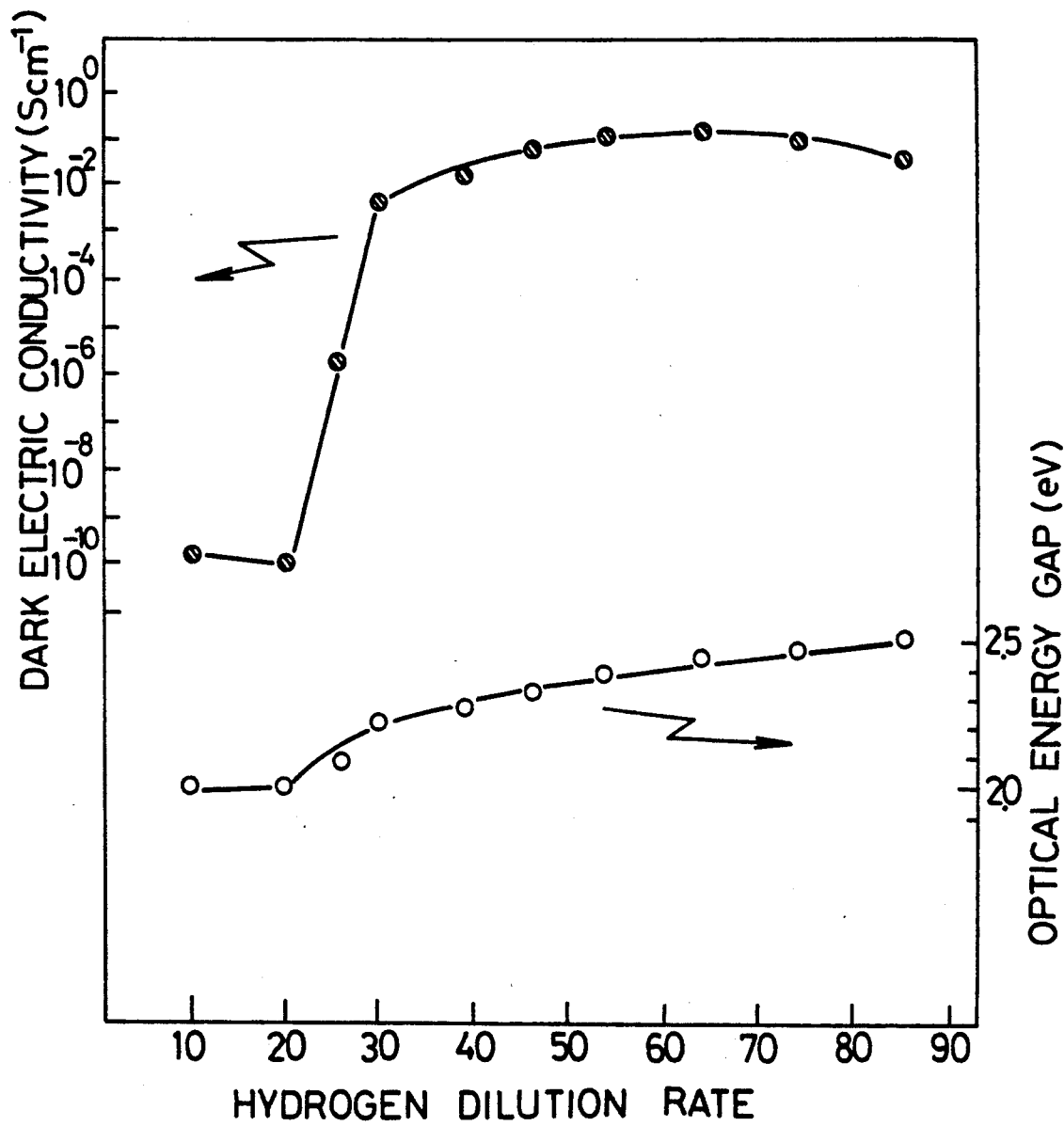
FIG. 10 is a characteristic graph showing the relation between the hydrogen dilution rate and the dark electric conductivity in a doped SiC film according to the present invention.

The test results are shown in FIG. 10. In these tests, hydrogen-diluted diborane gas having a concentration of 10,000 ppm is used for decreasing the amount of hydrogen gas introduced with diboran gas.

As is apparent from FIG. 10, in the case of the hydrogen dilution rate $\gamma$ of less than 30, high dark electric conductivity cannot be obtained, but in the case of the hydrogen dilution rate $\gamma$ of not less than 30, the dark electric conductivity is greatly improved to as high as not less than $10^{-3}$ Scm$^{-1}$. And the Raman spectrum of each of samples, each exhibiting the above described high dark electric conductivity, has a clear peak in the vicinity of 520 cm$^{-1}$.

COMPARATIVE EXAMPLE 4

Comparative tests are performed by using a parallel plate high frequency plasma CVD device with the same gas flow rate as that of Example 4.

In these comparative tests, the substrate temperature is 200° C., the reaction gas pressure is 0.6 Torr, and the high frequency power is 40 W.

The test results show that the dark electric conductivity of the obtained films are not more than $10^{-5}$ Scm$^{-1}$, respectively. And no peak is observed in the vicinity of 520 cm$^{-1}$ of the Raman shift.

EXAMPLE 5

SiC films are formed under the same conditions as those of Example 1 except for the flow rate of the mixture gas for testing the effect of the hydrogen dilution rate $\gamma$ on the dark electric conductivity of the nondoped SiC film.

At this time, diborane gas for doping is not supplied.

Figure 11:
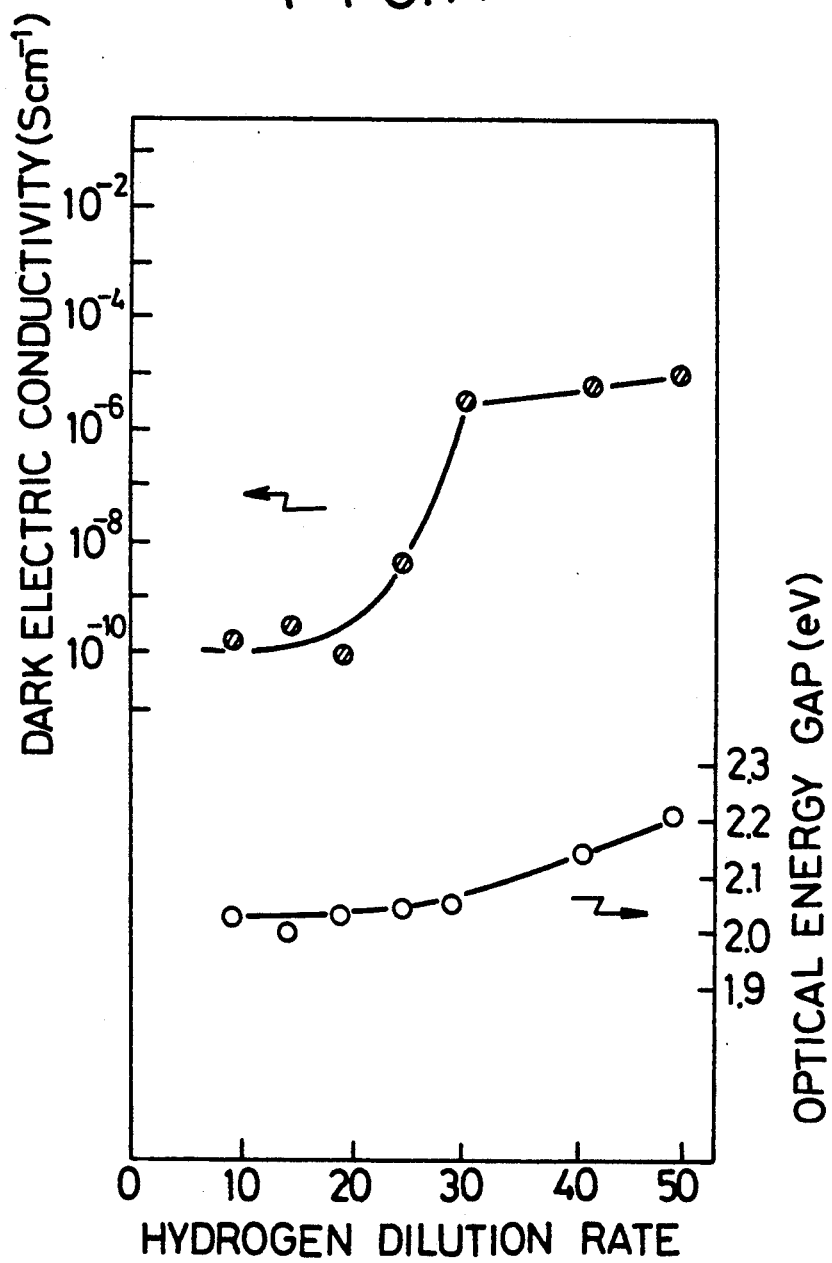
FIG. 11 is a characteristic graph showing the relation between hydrogen dilution rate γ and both optical energy gap and dark electric conductivity in a nondoped SiC film according to the present invention.

The test results are shown in FIG. 11. As is apparent from FIG. 11, the dark electric conductivity is greatly improved to as high as not less than $10^{-6}$ Scm$^{-1}$ when the hydrogen dilution rate $\gamma$ is not less than 30. And the Raman spectrum of each samples, each exhibiting the above described high dark electric conductivity, has a peak in the vicinity of 520 cm$^{-1}$.

COMPARATIVE EXAMPLE 5

Comparative tests are performed by using a parallel plate high frequency plasma CVD device with the same gas flow rate as that of Example 5. In these comparative tests, the substrate temperature is 200° C., the reaction gas pressure is 0.6 Torr, and the high frequency power is 40 W.

The test results show that the dark electric conductivity of each of the obtained nondoped SiC films is not less than $10^{-9}$ Scm$^{-1}$. And no peak is observed in the vicinity of 520 cm$^{-1}$ of the Raman shift.

EXAMPLE 6

The nondoped SiC film is also tested on the substrate temperature, the microwave power, the gas pressure within the reaction chamber, similarly to the p type SiC film.

The test results show that the dark electric conductivity of the nondoped SiC film is decreased by three to four figures from that of the boron-doped p type SiC film. But the nondoped SiC film has the same tendency as that of the born-doped p type SiC film. Namely, the nondoped SiC film formed under the same conditions as those of the boron-doped p type SiC film having high electric conductivity, exhibits a dark electric conductivity of not less than $10^{-6}$ Scm$^{-1}$, which is increased by not less than three figures from that of nondoped SiC film formed by the conventional high frequency plasma CVD method ($10^{-9}$ Scm$^{-1}$).

In the preceding examples, microwave of 2.45 GHz is used. The frequency of the microwave is not limited to this value. Other microwave of not less than 100 MHz, which is transmitted by way of a guide, can be used in forming microcrystalline silicon-containing SiC semiconductor films, each having a high dark electric conductivity.

EXAMPLE 7

Figure 12:
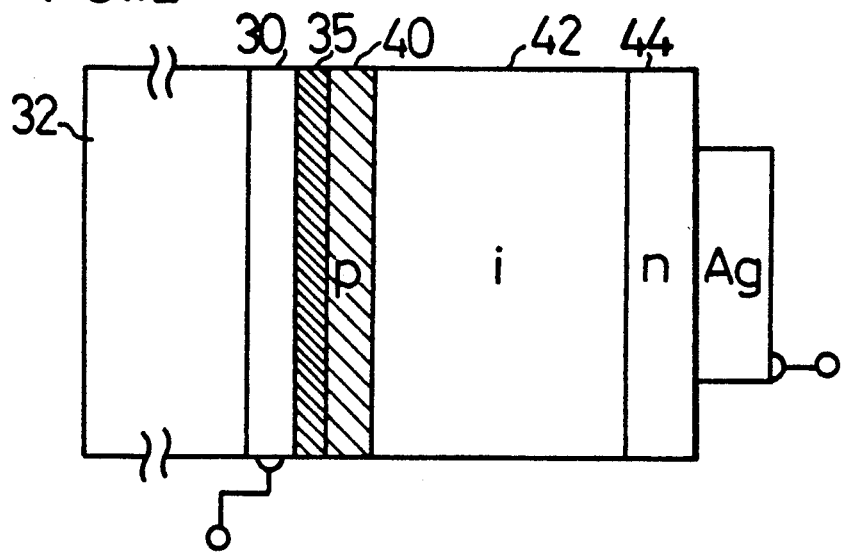
FIG. 12 is a schematic view of a solar cell to which the SiC film according to the present invention, is applied.

An amorphous solar cell is formed on a glass substrate 32 coated with a transparent electrode (TCO) 30 by using a p type microcrystalline silicon-containing SiC film (Eg=2.55 eV, $\sigma d = 10^{-1}$ Scm$^{-1}$) formed by ECRCVD method as shown in FIG. 12.

In FIG. 12, a p-type a-SiC film 35 having a thickness of 20 Å and a p-type microcrystalline silicon-containing SiC film 40 having a thickness of 200 Å are formed by ECRCVD method while an i-type a-Si film 42 having a thickness of 5000 Å and an n-type microcrystalline Si film 44 having a thickness of 300 Å are formed by well known high frequency plasma CVD method.

The a-SiC film 35 formed between the transparent electrode 30 and the p-type microcrystalline silicon-containing SiC film 40 serves as a buffer layer for preventing the transparent electrode 30 from being blocked in forming the p-type microcrystalline silicon-containing SiC film 40, and is formed by reducing the microwave power to be supplied to the ECRCVD device.

Figure 13:
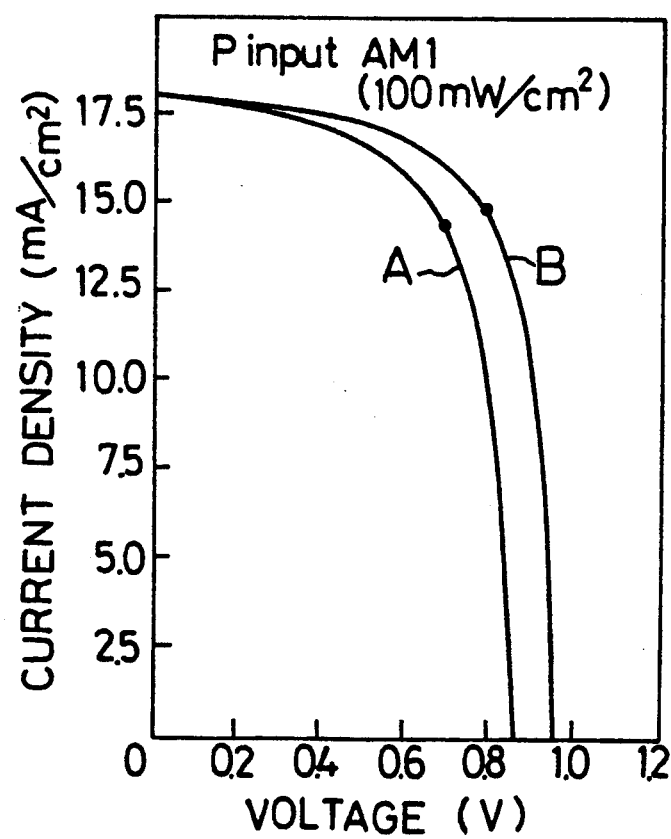
FIG. 13 is a characteristic graph of the solar cell of FIG. 12.

The current-voltage characteristic obtained by irradiating the above described solar cell with solar simulater light having a light intensity of AM 1,100 mw/cm$^2$ is shown by a curve B in FIG. 13. In FIG. 13, the current-voltage characteristic of a comparative solar cell A, of which the p, i, and n layers are formed by high frequency plasma CVD method is also shown for comparison.

Table 1 shows the characteristics of each of the comparative solar cell A and the solar cell B according to this Example.

The p layer of the comparative solar cell A is composed of a p-type a-SiC film having a thickness of 150 Å, Eg of 2.0 eV and $\sigma d$ of $5 \times 10^{-6}$ Scm$^{-1}$. No buffer layer is formed between the p layer and the transparent electrode. The i layer and the n layer of the comparative solar cell A is formed similarly to that of p layer by ECRCVD method.

As is apparent from Table 1 and FIG. 13, the release volume Voc of the solar cell B is 965 mV. In contrast, the release volume Voc of the solar cell A is 875 mV. This difference results from that the p-type microcrystalline silicon-containing SiC film has an optical energy gap Eg larger than that of p-type a-SiC film.

The curve factor FF of the solar cell B is improved from 66% to 68.9% as compared with the solar cell A. This is considered to result from the improvement in electric conductivity. Because of the increase in release voltage Voc and the improvement in curve factor FF, the photo-electric conversion efficiency Eff of the solar cell B is improved by not less than 10% as compared with that of the conventional solar cell A.

TABLE 1

| | Release Voltage Voc(mV) | Current Density Jsc(mA/cm$^2$) | Curve Factor (FF) (%) | Photo-Electric Conversion Efficiency (Eff) (%) |
|---|---|---|---|---|
| A | 875 | 17.8 | 66.0 | 10.3 |
| B | 965 | 17.8 | 68.9 | 11.8 |

What is claimed is:

1. A silicon carbide semiconductor film mainly composed of silicon, carbon and hydrogen; said silicon carbide semiconductor film having microcrystalline silicon islands, an optical energy gap of not less than 2.0 eV, and a dark electric conductivity of not less than $10^{-6}$ Scm; wherein the Raman scattering light of said silicon carbide film which shows the presence of the microcrystalline silicon has a peak in the vicinity of 520 cm$^{-1}$.

2. A silicon carbide semiconductor film according to claim 1, wherein said silicon carbide semiconductor film has a structure wherein microcrystalline silicon is distributed like islands.

3. A silicon carbide semiconductor film containing islands of microcrystalline Si, wherein said silicon carbide film is subjected to a valence electron control by doping said film with 0.05 to 4% of group IIIa elements to p-type to have a dark electric conductivity of not less than $10^{-3}$ Scm$^{-1}$.

4. An amorphous solar cell comprising a p layer, an i layer and an n layer, said p layer being composed of p-type SiC film containing islands of microcrystalline silicon.

5. An amorphous solar cell according to claim 4, wherein said i layer is composed of an i-type a-Si film and said n layer is composed of an n-type microcrystalline Si film.

* * * * *